(12) United States Patent
Ong et al.

(10) Patent No.: US 11,532,770 B2
(45) Date of Patent: Dec. 20, 2022

(54) MINING UNEXPLORED CHEMISTRIES FOR PHOSPHORS FOR HIGH-COLOR-QUALITY WHITELIGHT-EMITTING DIODES

(71) Applicant: THE REGENTS OF THE UNIVERSITY OF CALIFORNIA, Oakland, CA (US)

(72) Inventors: Shyue Ping Ong, La Jolla, CA (US); Jungmin Ha, La Jolla, CA (US); Zhenbin Wang, La Jolla, CA (US); Joanna McKittrick, La Jolla, CA (US); Won Bin Im, La Jolla, CA (US); Yoon Hwa Kim, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 296 days.

(21) Appl. No.: 16/755,533

(22) PCT Filed: Oct. 15, 2018

(86) PCT No.: PCT/US2018/055897
§ 371 (c)(1),
(2) Date: Apr. 10, 2020

(87) PCT Pub. No.: WO2019/075469
PCT Pub. Date: Apr. 18, 2019

(65) Prior Publication Data
US 2021/0193880 A1 Jun. 24, 2021

Related U.S. Application Data

(60) Provisional application No. 62/572,084, filed on Oct. 13, 2017.

(51) Int. Cl.
| C09K 11/77 | (2006.01) |
| H01L 33/50 | (2010.01) |
| C01F 7/166 | (2022.01) |

(52) U.S. Cl.
CPC ........... H01L 33/502 (2013.01); C01F 7/166 (2013.01); C09K 11/7721 (2013.01);
(Continued)

(58) Field of Classification Search
CPC .... C09K 11/7721; C09K 11/7734; C01F 7/66
See application file for complete search history.

(56) References Cited

U.S. PATENT DOCUMENTS

| 4,110,660 A | 8/1978 | Wolfeocr |
| 4,827,187 A | 5/1989 | Verlijsdonk |

(Continued)

OTHER PUBLICATIONS

Li et al, 'Luminescence properties and charge compensation of Sr3Al2O6 doped with Ce3+ and alkali metal ions', Materials Chemistry and Physics, vol. 124, Dec. 1, 2010, p. 1094-1099.
(Continued)

*Primary Examiner* — Matthew E. Hoban
(74) *Attorney, Agent, or Firm* — Mayer & Williams, PC; Stuart Mayer

(57) ABSTRACT

A light emitting diode (LED) assembly includes an LED light source having a first light output with a characteristic spectrum and at least one phosphor through which the first light output passes. The phosphor includes the quaternary compound M—Li—Al—O, where M is Ba, Sr, or Ca, activated by $Eu^{2+}$ or $Ce^{3+}$.

6 Claims, 15 Drawing Sheets

(52) U.S. Cl.
CPC ...... *C09K 11/7734* (2013.01); *C01P 2002/54* (2013.01); *C01P 2002/72* (2013.01); *C01P 2002/74* (2013.01); *C01P 2002/77* (2013.01)

(56) References Cited

U.S. PATENT DOCUMENTS

| | | |
|---|---|---|
| 5,424,006 A | 6/1995 | Murayama |
| 2019/0326481 A1* | 10/2019 | Seibald .............. C09K 11/0883 |

OTHER PUBLICATIONS

Wang et al. 'Mining Unexplored Chemistries for Phosphors for High-Color-Quality White-Light-Emitting Diodes', Joule. vol. 2. May 16, 2018 (May 16, 2018), p. 1-13.

\* cited by examiner

Figure 1A
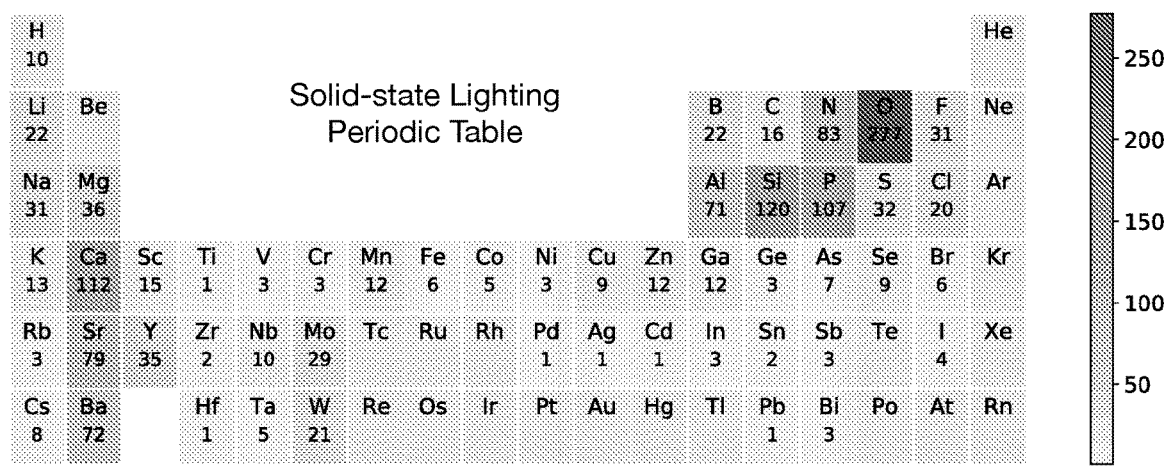
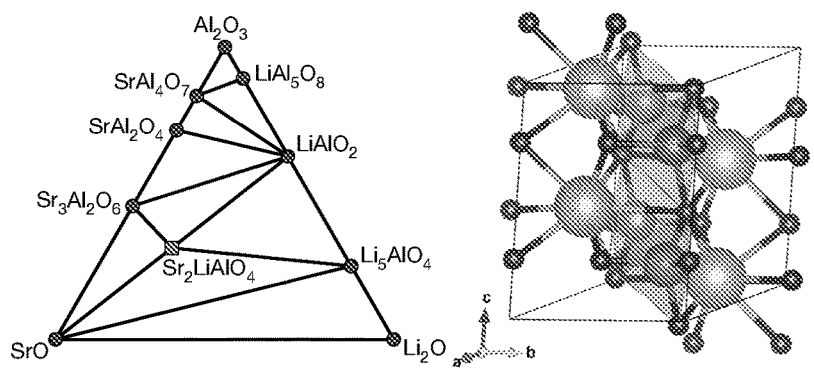
Figure 1B
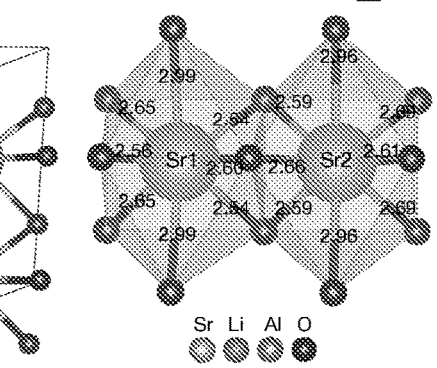
Figure 1C

Table 1

| Chemical space | Compound | | $E_{hull}$ (meV/atom) | Phosphors |
|---|---|---|---|---|
| | Known | Derivation | | |
| Sr-Li-P-O | SrLiPO$_4$ | RbLiCrO$_4$ (ICSD-72551) | 27 | SrLiPO$_4$:Eu$^{2+}$[1] |
| Ba-Y-P-O | Ba$_3$Y(PO$_4$)$_3$[a] | YbK$_3$(SO$_4$)$_3$ (ICSD-200547) | 11 | Ba$_3$Y(PO$_4$)$_3$:Eu$^{2+}$[2] |
| Sr-Y-P-O | Sr$_3$Y(PO$_4$)$_3$[a] | YbCs$_3$(SO$_4$)$_3$ (ICSD-200932) | 34 | Sr$_3$Y(PO$_4$)$_3$:Eu$^{2+}$,Mn$^{2+}$[3] |
| Ba-Y-Al-O | Ba$_6$Y$_2$Al$_4$O$_{15}$ | Ba$_6$Y$_2$Fe$_4$O$_{15}$ (ICSD-248954) | 0 | Ba$_6$Y$_2$Fe$_4$O$_{15}$:Sn$^{2+}$[4] |

[a] The crystal structures of M$_3$Y(PO$_4$)$_3$ (M = Ba/Sr) are disordered in experiment, of which the lowest energy ordered structures are well reproduced in our calculations.

Figure 4

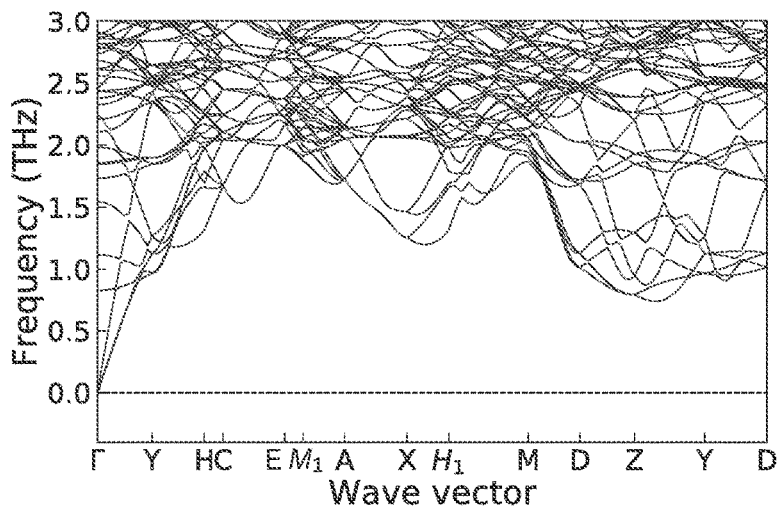

Figure 5

Table 2.
| Site | Calculated | | | Experimental | | | Occupancy | Wyckoff Position |
|---|---|---|---|---|---|---|---|---|
| | x | y | z | x | y | z | | |
| Sr1 | 0.22801 | 0.25000 | 0.43191 | 0.23929 (67) | 0.25000 | 0.43659 (60) | 1 | 2e |
| Sr2 | 0.27038 | 0.25000 | 0.94227 | 0.24830 (66) | 0.25000 | 0.93386 (60) | 1 | 2e |
| Li3 | 0.30224 | 0.75000 | 0.69253 | 0.26130 (610) | 0.75000 | 0.66930 (500) | 1 | 2e |
| Al4 | 0.27851 | 0.75000 | 0.19918 | 0.13610 (480) | 0.75000 | 0.40720 (470) | 1 | 2e |
| O5 | 0.47754 | 0.50758 | 0.25164 | 0.50840 (320) | 0.49180 (280) | 0.25280 (260) | 1 | 4f |
| O6 | 0.09917 | 0.75000 | 0.37670 | 0.27660 (250) | 0.75000 | 0.19480 (260) | 1 | 2e |
| O7 | 0.11359 | 0.75000 | 0.92812 | 0.11340 (350) | 0.75000 | 0.89890 (270) | 1 | 2e |
Figure 6
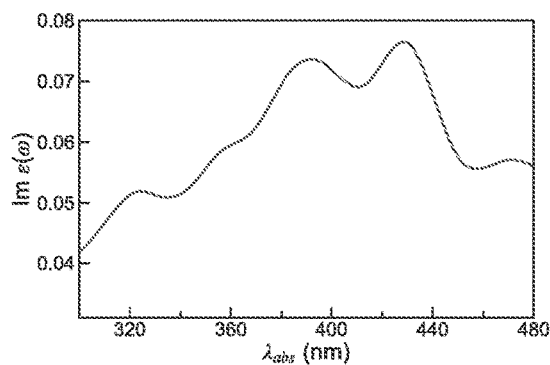
Figure 7A
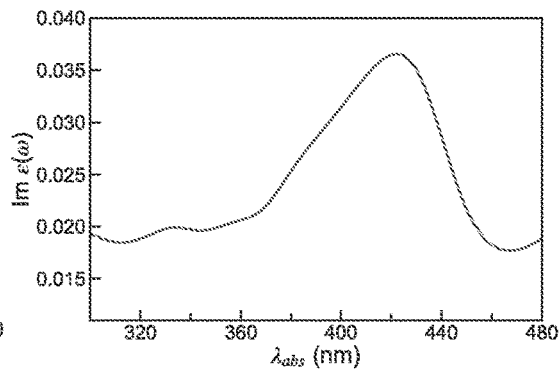
Figure 7B Table 3.

| Rietveld refinement parameters | | Calculated |
| --- | --- | --- |
| Symmetry | Monoclinic | Monoclinic |
| Space group | $P2_1/m$ | $P2_1/m$ |
| | | |
| a/nm | 0.581998(9) | 0.58308 |
| b/nm | 0.563362(8) | 0.56386 |
| c/nm | 0.665907(9) | 0.66545 |
| β/° | 106.483(1) | 106.70 |
| Volume/nm³ | 0.209362(6) | 0.20956 |
| $R_{exp}$ (%) | 3.26 | - |
| $R_{wp}$ (%) | 9.11 | - |
| $R_p$ (%) | 6.69 | - |
| GOF | 2.79 | - |

Figure 10A
Figure 10B
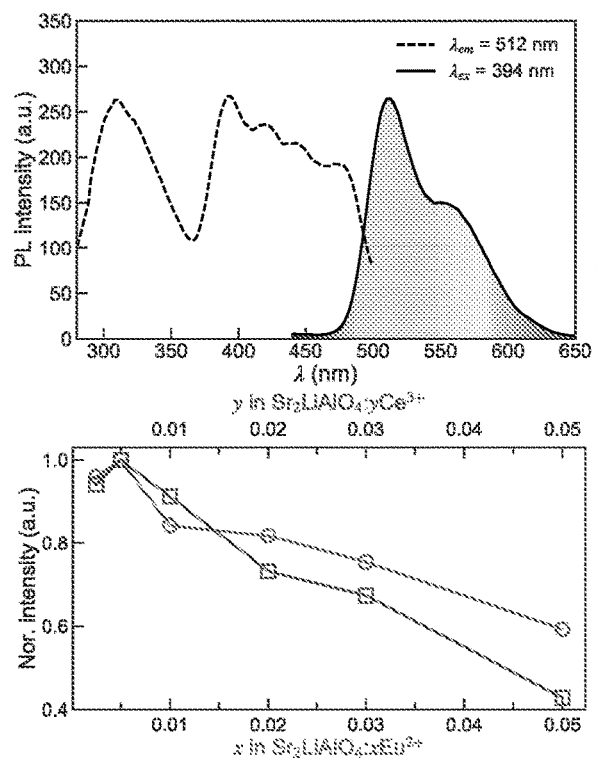
Figure 10C
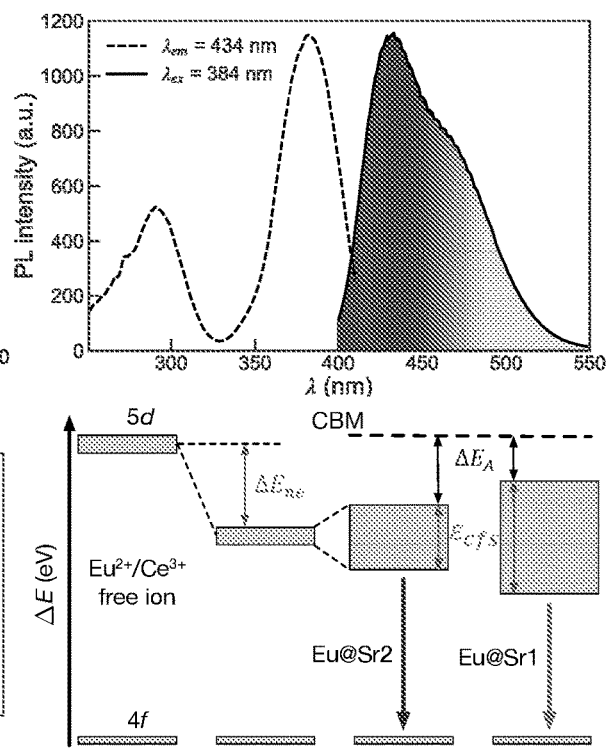
Figure 10D

Table 4.

| current [mA] | CIE x | CIE y | CCT [K] | CRI |
|---|---|---|---|---|
| 60 | 0.301 | 0.323 | 7527 | 93 |
| 80 | 0.298 | 0.322 | 7820 | 93 |
| 100 | 0.296 | 0.321 | 8013 | 92 |
| 120 | 0.294 | 0.320 | 8205 | 92 |
| 140 | 0.291 | 0.318 | 8560 | 91 |
| 160 | 0.289 | 0.316 | 8788 | 92 |

Figure 17

Table 5.

| current [mA] | CIE x | CIE y | CCT [K] | CRI |
|---|---|---|---|---|
| 60 | 0.308 | 0.349 | 6857 | 94 |
| 80 | 0.306 | 0.353 | 6905 | 94 |
| 100 | 0.304 | 0.354 | 7000 | 93 |
| 120 | 0.303 | 0.355 | 7095 | 93 |
| 140 | 0.303 | 0.355 | 7198 | 93 |
| 160 | 0.302 | 0.354 | 7253 | 93 |

Figure 18

Table 6.

| phosphor | IQE at room temperature (%) | PL intensity at 150°C(%)[a] | CCT of WLED device (K) | CRI of WLED device | LE (lm/W) | ref. |
|---|---|---|---|---|---|---|
| $Sr_2LiAlO_4:Eu^{2+}$ | 25 | 74 | 7527 | 93 | 36 | this work |
| $Sr_2LiAlO_4:Ce^{3+}$ | 32 | 91 | over 10000 | - | 19 | this work |
| $Sr_2LiAlO_4:Eu^{2+}$ + $Sr_2LiAlO_4:Ce^{3+}$ | - | - | 6857 | 94 | 28 | this work |
| $Y_3Al_5O_{12}:Ce^{3+}$ | ~86 | 60 | - | 75 | 39 | [5,6] |
| $Ca_6BaP_4O_{17}:Eu^{2+}$ | 65 | ~18 | 6500 | 78 | 31 | [6] |
| $Ba_{0.93}Eu_{0.07}Al_2O_4$ | 30 | 63 | 5578 | 85 | ~20 | [7] |
| $Li_2SrSiO_4:Eu^{2+}$ | ~12[6] | ~60[7]b | - | - | 35 | [8–10] |
| $NaSrBO_3:Ce^{3+}$ | 74.7 | ~80 | 5763 | 93[c] | 26.2 | [11] |
| $CaAlSiN_3:Ce^{3+}$ | - | 90 | 3722 | 70 | 51 | [12] |
| $Li-\alpha-SiAlON:Eu^{2+}$ | - | - | 6150 | 72 | 43 | [13] |

[a] The PL intensity was normalized based on the intensity at room temperature.
[b] This value calculated from the external quantum efficiency of 27.54 % for $Li_2(Sr_{0.985}Eu_{0.006}Ce_{0.009})SiO_4$.
[c] The WLED device in this work was made by mixture of $NaSrBO_3:Ce^{3+}$, $(Ba,Sr)_2SiO_4:Eu^{2+}$ and $CaAlSiN_3:Eu^{2+}$ phosphors.

Figure 19

Figure 20A
Figure 20B
Figure 20C
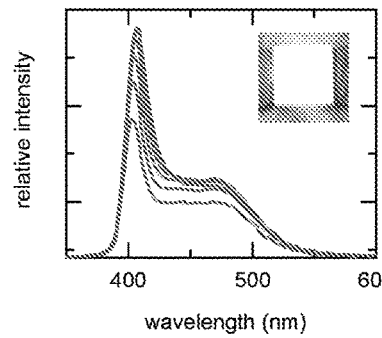
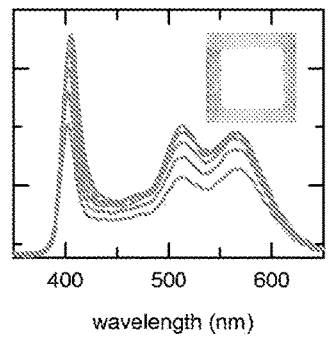
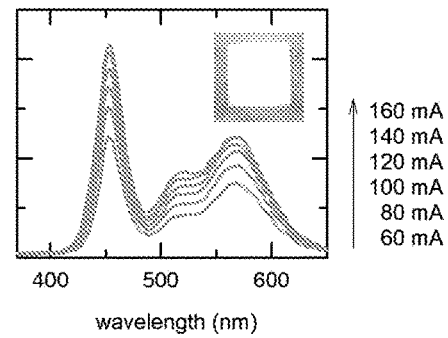
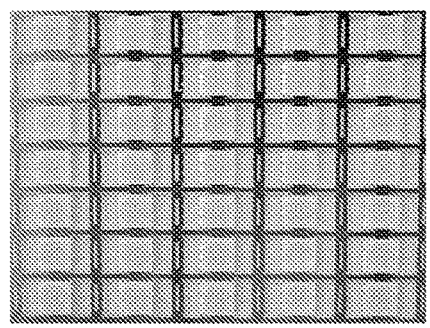
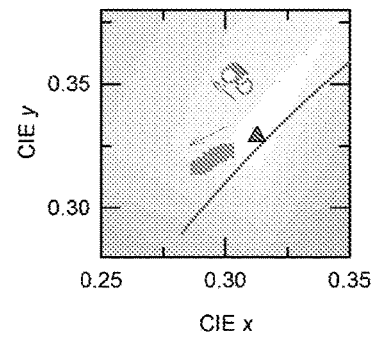
Figure 20D
Figure 20E
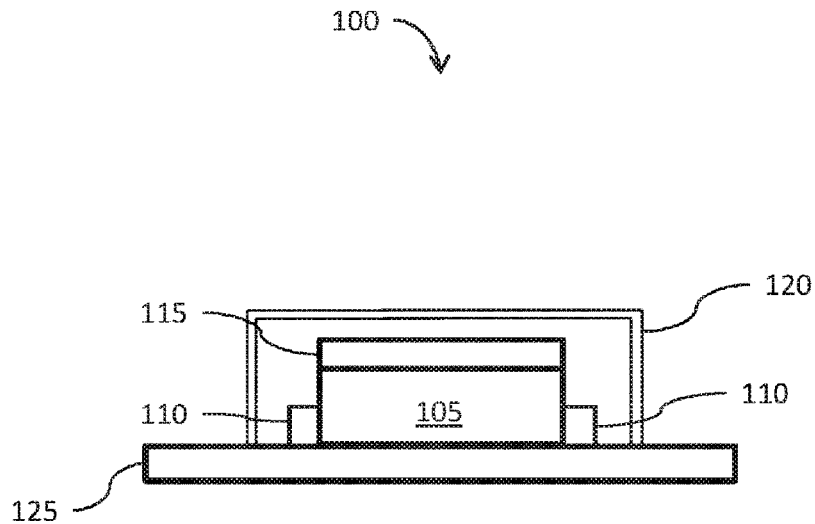
Figure 21

MINING UNEXPLORED CHEMISTRIES FOR PHOSPHORS FOR HIGH-COLOR-QUALITY WHITELIGHT-EMITTING DIODES

GOVERNMENT FUNDING

This invention was made with Government support under 1411192 awarded by the National Science Foundation. The Government has certain rights in the invention.

BACKGROUND

Phosphor-converted white-light-emitting diodes (pc-WLEDs) are among the most promising solid-state lighting (SSL) technologies due to their high-energy efficiency and superior durability and reliability. For general illumination, we need a warm white light with excellent quantum efficiency, resistance to thermal quenching, and color quality, i.e., a low color-correlated temperature (CCT)<3000 K and a high color rendering index (CRI)>85. Typical commercial WLEDs based on blue-emitting (~450 nm) LED chips combined with a yellow-emitting phosphor ($Y_3Al_5O_{12}$:$Ce^{3+}$) have poor CRI<80 and high CCT>5000 K. To improve the CRI and CCT, an alternative approach is to use near-ultraviolet (near-UV, 380-420 nm) or blue LED chips with a mixture of red, green and blue phosphors. $Lu_3Al_5O_{12}$:$Ce^{3+}$ and $(Ba,Sr)_2SiO_4$:$Eu^{2+}$ are two well-known green emitters with good photoluminescence (PL) properties used for these phosphor mixtures. Unfortunately, the former requires the rare-earth Lu in large quantities, while the latter suffers from severe thermal quenching. Meanwhile, most commercial red-emitters are $Eu^{2+}$-activated nitrides, such as $CaAlSiN_3$:$Eu^{2+}$ and $Sr_2Si_5N_8$:$Eu^{2+}$, which are synthesized under harsh conditions (high temperature and high pressure). Yet another way to generate white light with high color quality is to leverage on a single-phase broad-band emitter that covers a wide range of the visible spectrum (400~700 nm). $Ba_{0.93}Eu_{0.07}Al_2O_4$ is an example of a recently discovered broad-band phosphor with good CRI>80 and CCT<4000 K, but its synthesis requires a high temperature of 1450° C. and a low pressure of 667 Pa.

There is therefore a need to discover new earth-abundant phosphors with reasonably facile synthesis for pc-WLED applications. Hitherto, the discovery of phosphor materials has largely taken place through painstaking experiments, such as using exploratory crystal growth, combinatorial chemistry screening and single particle-diagnosis, in an Edisonian fashion. In recent years, high-throughput density functional theory (DFT) calculations have emerged as a powerful complementary tool to experiments to accelerate materials discovery, with successes having been demonstrated in the many application areas. By enabling rapid evaluation across multiple application-specific properties, DFT calculations can be used to effectively screen thousands of materials to identify a small subset of candidates for subsequent synthesis and experimental evaluation. Nevertheless, there have been no successful demonstrations of in silico phosphor discovery to date, no doubt due in part to extensive experimental efforts in the field as well as the difficulty in predicting optical properties with DFT.

SUMMARY

An earth-abundant phosphor host $Sr_2LiAlO_4$ is presented, which is believed to be the first known Sr—Li—Al—O quaternary compound. $Sr_2LiAlO_4$ was identified via a carefully-targeted data-driven structure prediction and DFT screening effort guided by statistical analysis of known phosphors in the Inorganic Crystal Structure Database (ICSD). We demonstrate that $Sr_2LiAlO_4$ is predicted by DFT calculations to be thermodynamically and dynamically stable and to have the necessary band gap, structural rigidity and near-UV excitation wavelength when activated with either $Eu^{2+}$ or $Ce^{3+}$. High purity $Sr_2LiAlO_4$ was synthesized via industrially-scalable methods and characterized using X-ray diffraction and photoluminescence spectroscopy. The $Eu^{2+}$- and $Ce^{3+}$-activated $Sr_2LiAlO_4$ phosphors exhibit broad emissions of $\lambda_{max}$~512 nm (green-yellow) and $\lambda_{max}$~434 nm (blue), respectively, with excellent thermal quenching resistance of >88% intensity at 150° C. A prototype pc-WLED utilizing $Sr_2LiAlO_4$:$Eu^{2+}$ yields an excellent CRI>90.

BRIEF DESCRIPTION OF THE DRAWINGS

FIG. 1A shows the frequency at which each element appears in compounds having the word "phosphor" in the publication title in the 2017 version of ICSD; FIG. 1B shows the calculated phase diagram, which indicates that $Sr_2LiAlO_4$ is predicted to be a stable phase at 0K; and FIG. 1C shows the crystal structure of $Sr_2LiAlO_4$ (spacegroup: $P2_1/m$).

FIG. 4 shows a table (Table 1) of four known compounds in the Sr—Li—P—O, Ba/Sr—Y—P—O and Ba—Y—Al—O chemical spaces, their derivations, computed energy above ehull ($E_{hull}$) and the relevant phosphors.

FIG. 5 shows the calculated phonon spectrum for the predicted $Sr_2LiAlO_4$ ($P2_1/m$) crystal structure.

FIG. 6 shows a table (Table 2) of the calculated and experimental structural parameters of $Sr_2LiAlO_4$, where the experimental values were obtained from XRD Rietveld refinement of the solid-state reaction samples.

FIGS. 7A and 7B respectively show the calculated absorption spectra for $Sr_2LiAlO_4$:$0.0625Eu^{2+}$ and $Sr_2LiAlO_4$:$0.125Ce^{3+}$.

FIG. 10A shows the measured PL spectrum of the $Sr_2LiAlO_4$:$0.005Eu^{2+}$ phosphor excited at 394 nm; FIG. 10B shows the PL spectrum of the $Sr_2LiAlO_4$:$0.005Ce^{3+}$ phosphor measured at 384 nm excitation; FIG. 10C shows the normalized emission intensity of $Sr_2LiAlO_4$:$xEu^{2+}$ (under 394 nm excitation, circular values) with respect to the $Eu^{2+}$ (x) concentration and $Sr_2LiAlO_4$:$yCe^{3+}$ (under 384 nm excitation, square values) with respect to the $Ce^{3+}$ (y) concentration; and FIG. 10D shows the schematic energy level diagram for $Eu^{2+}$/$Ce^{3+}$ ions in the $Sr_2LiAlO_4$ host crystal structure.

FIG. 17 shows a table (Table 4) of the optical properties of a white light-emitting diode (WLED) fabricated using $Sr_2LiAlO_4:0.005Eu^{2+}$ phosphor with a blue LED ($\lambda_{max}$=450 nm) excitation).

FIG. 18 shows a table (Table 5) of the optical properties of a WLED fabricated using the mixed $Sr_2LiAlO_4:0.005Ce^{3+}$ and $Sr_2LiAlO_4:0.005Eu^{2+}$ phosphor with a near-UV LED ($\lambda_{max}$=400 nm) excitation.

FIG. 19 shows a table (Table 6) the internal quantum efficiency (IQE) and photoluminescence (PL) intensity of several phosphors and correlated color temperature (CCT), color rendering index (CRI) and luminous efficacy (LE) of a WLED constructed with these phosphors.

FIG. 20A shows the electroluminescence (EL) spectra and a photograph of the InGaN LED ($\lambda_{max}$=400 nm)+$Sr_2LiAlO_4:0.005Ce^{3+}$ phosphor; FIG. 20B shows the EL spectra and photograph of the InGaN LED ($\lambda_{max}$=400 nm)+$Sr_2LiAlO_4:0.005Ce^{3+}$+$Sr_2LiAlO_4:0.005Eu^{2+}$ phosphor; FIG. 20C shows the EL spectra and photograph of the InGaN LED ($\lambda_{max}$=450 nm)+$Sr_2LiAlO_4:0.005Eu^{2+}$ phosphor; FIG. 20D shows a photograph of WLEDs packaged with $Sr_2LiAlO_4:0.005Eu^{2+}$ phosphor; and FIG. 20E shows the CIE chromatic coordinated of the fabricated $Sr_2LiAlO_4$-based phosphors WLED under various forward bias currents.

FIG. 21 shows a schematic diagram of one example of an exemplary LED assembly 100 according to the disclosed embodiments.

DETAILED DESCRIPTION

Data-Driven Discovery of New Phosphors

As shown in FIG. 1A, the search for new phosphor hosts began by constructing a "solid-state lighting" periodic table from a statistical analysis of all compounds in the 2017 version of the ICSD with the word "phosphor" in the publication title. FIG. 1A shows the frequency at which each element appears in compounds having the word "phosphor" in the publication title in the 2017 version of ICSD. Only non-rare-earth elements are shown. Elements with frequency 0 are shaded in gray. The high frequency of elements N, S, F and Cl can be ascribed to the fact that (oxy)nitrides, (oxy)halides and sulfides are some of the most well-studied phosphor materials. Nevertheless, oxides are overwhelmingly preferred in practical SSL applications due to their typically more facile synthesis and better chemical stability under ambient conditions; therefore, these other anion types will not be further considered in this work. We may observe a preponderance of the alkaline-earth metals (Mg/Ca/Sr/Ba), alkali metals (Li/Na/K) and main group elements (Al/Si/P/B) among known phosphors. The presence of Ca and Sr is not surprising, given that the ionic radii of $Ca^{2+}$ and $Sr^{2+}$ are similar to those of the common $Ce^{3+}$ and $Eu^{2+}$ activators. $Na^+$ also presents a high frequency in phosphor hosts due to its similar size to $Eu^{2+}$. However, activation via aliovalent substitution of $Eu^{2+}$ on $Na^+$ would require the identification of the most stable charge-compensating defect and the use of large-supercell DFT calculations. Therefore, we have chosen to focus on systems containing $Sr^{2+}/Ba^{2+}/Ca^{2+}$ in this work as these are isovalent with $Eu^{2+}$. Given that phosphates, silicates, aluminates and borates are among the most commonly studied oxides in SSL, we then proceeded to identify opportune chemistries for novel phosphor host discovery in the ternary M-X—O (M=Ba/Sr/Ca, X=P/Si/Al/B) and quaternary M-L-X—O (M=Ba/Sr/Ca, L=Li/Mg/Y, X=P/Si/Al/B) oxides.

Figure 2:
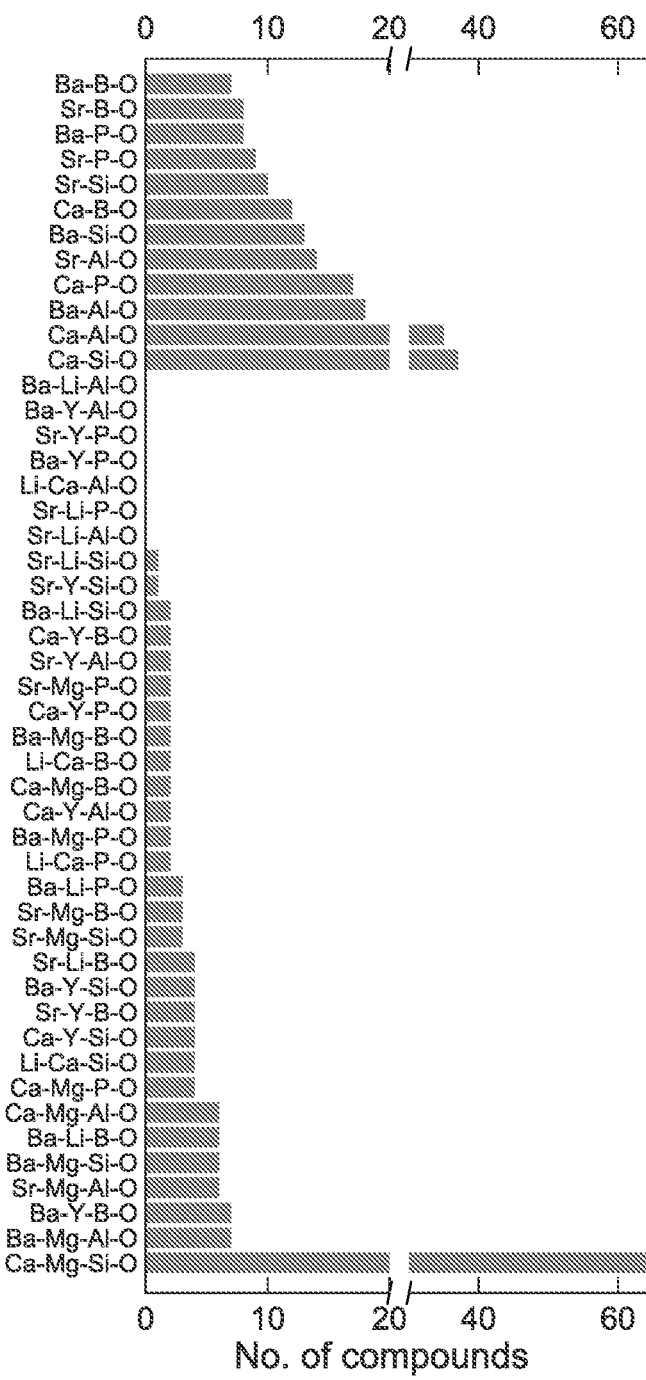
FIG. 2 shows the number of known materials in the Inorganic Crystal Structure Database in the ternary M-X—O and quaternary M-L-X—O (M=Ba/Sr/Ca; L=Li/Mg/Y; X=P/Si/Al/B) chemical spaces.
Figure 3:
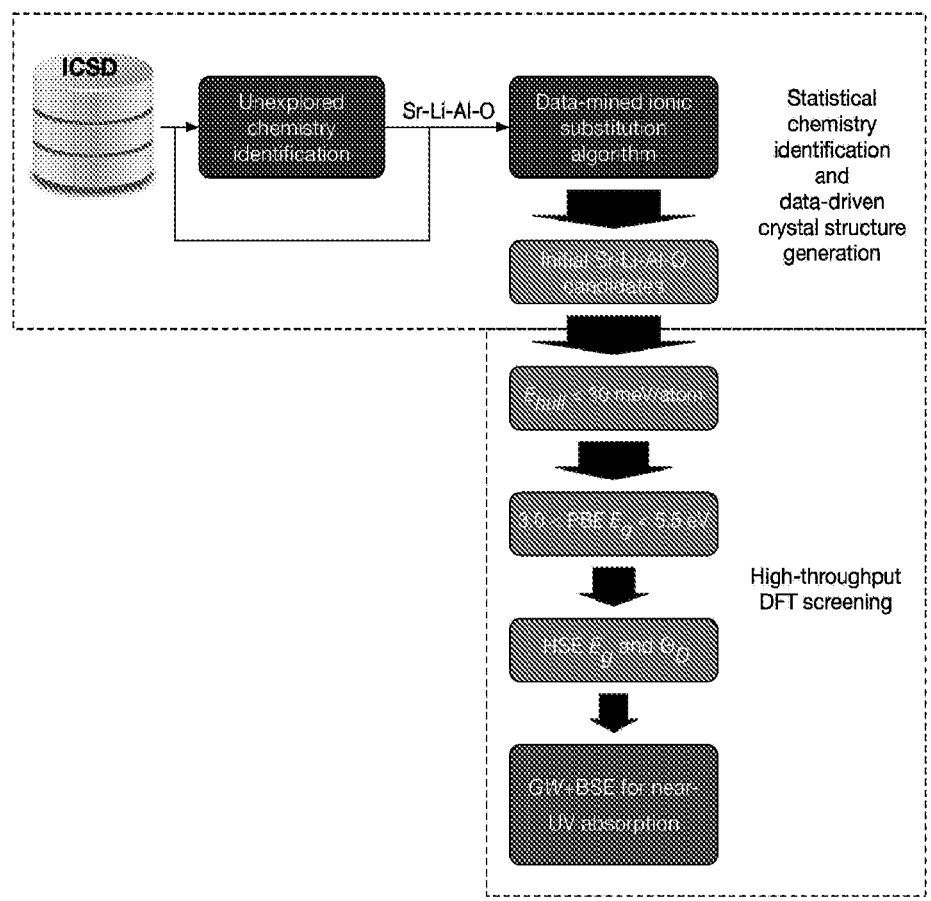
FIG. 3 is a computational high throughput screening workflow for identifying promising broad-band emitters.

We find that while ternary M-X—O oxides have been relatively well-explored, significant opportunities exist in quaternary M-L-X—O oxides. In particular, there are no reported compounds in the ICSD in seven chemistries—Ba/Sr/Ca—Li—Al—O, Sr—Li—P—O, Ba/Sr—Y—P—O, and Ba—Y—Al—O (FIG. 2). A further search of the larger Pauling File database turned up one known compound each in the Sr—Li—P—O, Ba/Sr—Y—P—O and Ba—Y—Al—O chemistries, and still no compounds in the Ba/Sr/Ca—Li—Al—O chemistries. We generated 918 new crystal structure candidates in these seven unexplored chemical systems by applying a data-mined ionic substitution algorithm on the entire ICSD (see Methods). As shown in FIG. 3, these candidates were then systematically evaluated via an efficiently-tiered series of DFT property calculations. FIG. 3 is a computational high throughput screening workflow for identifying promising broad-band emitters. $E_g$ is the host band gap calculated with both Perdew-Burke-Ernzerhof (PBE) functional and Heyd-Scuseria-Ernzerhof (HSE) functional. $\Theta_D$ is calculated Debye temperature. GW+BSE denotes the Bethe-Salpeter equation (BSE) calculation performed on top of $G_0W_0$.

The first criterion that any technological material must satisfy is synthesizability and stability. Thermodynamic stability is estimated by calculating the energy above the linear combination of stable phases in the 0 K DFT phase diagram, also known as $E_{hull}$. A typical threshold for synthesizability used in previous DFT screening works is an $E_{hull}$<30~50 meV/atom. We find that the four known compounds in Sr—Li—P—O, Ba/Sr—Y—P—O and Ba—Y—Al—O chemistries are indeed among the candidates generated by the structure prediction algorithm, and all four compounds have a calculated $E_{hull}$<35 meV/atom. Table 1 in FIG. 4 shows four known compounds in the Sr—Li—P—O, Ba/Sr—Y—P—O and Ba—Y—Al—O chemical spaces, their derivations, computed energy above ehull ($E_{hull}$) and the relevant phosphors. Known compounds are retrieved from Pauling File database.

The successful "prediction" of these "unseen" known phosphors gives us confidence that viable candidates are identified via the combination of the data-mined ionic substitution algorithm and DFT calculations. Among the remaining Ba/Sr/Ca—Li—Al—O chemical systems with no known compounds, we will focus primarily on on the Sr—Li—Al—O chemistry due the fact that $Sr^{2+}$ has an ionic radius (1.26 Å) that is closes to $Eu^{2+}$ (1.25 Å), compared to $Ba^{2+}$ (1.42 Å) or $Ca^{2+}$ (1.12 Å). Also, Li and Al are inexpensive, earth-abundant elements that tend to form rigid bonds in crystals.

FIG. 1B shows the calculated 0 K $SrO—Li_2O-A_2O_3$ phase diagram. The circles represent known stable phases in the Materials Project database and the square represents a new stable quaternary phase, $Sr_2LiAlO_4$. We find that one of the new candidates, $Sr_2LiAlO_4$, is predicted to be thermodynamically stable ($E_{hull}$=0). The computed phonon spectrum, shown in FIG. 5, confirms it to be also dynamically stable. The crystal structure of $Sr_2LiAlO_4$ (spacegroup: $P2_1/m$) is shown in FIG. 1C, and the structural parameters are provided in Table 2 of FIG. 6. The numbers in FIG. 1C indicate Sr—O bond length in angstroms. $Sr_2LiAlO_4$ is derived from $Ba_2LiReN_4$ (ICSD No. 411453) via a multispecies substitution of $Ba^{2+}$ with $Sr^{2+}$, Re with $Al^{3+}$, and $N^{3-}$ with $O^{2-}$. This is clearly a non-trivial crystal prediction that cannot be obtained easily replicated using traditional chemical intuition.

We evaluated the potential PL properties of the stable $Sr_2LiAlO_4$ host by calculating its electronic structure and Debye temperature ($\Theta_D$). The calculated band gap $E_g$ of $Sr_2LiAlO_4$ using the Perdew-Burke-Ernzerhof (PBE) functional is 4.19 eV, which suggests that it would yield a green-yellow emission with $Eu^{2+}$ activation based on the inverse relationship between experimental wavelength and the PBE $E_g$ previously reported by the current authors. In general, host materials that have a large photoionization barrier, defined as the energy gap between conduction band minimum (CBM) and excited 5d level, and are rigid tend to exhibit excellent thermal quenching resistance. The calculated bandgaps of $Sr_2LiAlO_4$ using the more accurate Heyd-Scuseria-Ernzerhof (HSE) functional and $G_0W_0$ are 5.91 eV and 6.00 eV, respectively. This large bandgap suggests a strong likelihood of a large photoionization barrier. The calculated $\Theta_D$ of $Sr_2LiAlO_4$ is 466 K, indicating that it has rigid crystal structure.

There are two symmetrically distinct Sr crystallographic sites (labelled as Sr1 and Sr2 in FIG. 1C) in $Sr_2LiAlO_4$, both of which are eight-fold coordinated with oxygen atoms. By performing an isovalent substitution a single $Eu^{2+}$ into a 2×2×2 supercell of $Sr_2LiAlO_4$ (16 formula units), we determined using DFT calculations that the $Eu^{2+}$ activator prefers the Sr1 site to the Sr2 site by about 35 meV. For $Ce^{3+}$ activation, we comprehensively evaluated various charge-neutral defect configurations, taking into account typical experimental synthesis conditions such as excess Li from its volatility at elevated temperature. We find that the $2Ce_{Sr}^{\bullet}+Li''_{Al}$ defect combination (Kröger-Vink notation) has the lowest defect formation energy compared to $2Ce_{Sr}^{\bullet}+V''_{Sr}$ (0.22 eV/$Ce^{3+}$ higher) and $Ce_{Sr}^{\bullet}+Li'_{Sr}$ (1.48 eV/$Ce^{3+}$ higher). Hence, we conclude that the substitution of $Ce^{3+}$ on $Sr^{2+}$ is likely to be charge compensated by excess $Li^+$ on the $Al^{3+}$ tetrahedra, as opposed to vacancy formation or excess $Li^+$ on the $Sr^{2+}$ site. This is consistent with the fact that the small $Li^+$ ion (ionic radius=0.9 Å) is likely to prefer the $AlO_4$ tetrahedron rather than the much larger $SrO_8$ site. Henceforth, we will use the shorthand notation commonly used in the phosphor community, $Sr_2LiAlO_4:xEu^{2+}$ and $Sr_2LiAlO_4:yCe^{3+}$, to denote the activated structures with compositions $Sr_{2-x}Eu_xLiAlO_4$ and $Sr_{2-y}Ce_yLi_{1+y/2}Al_{1-y/2}O_4$, respectively.

All subsequent DFT results on activated hosts, unless otherwise stated, were performed using the configuration with the lowest defect formation energy.

For efficient conversion, a phosphor should have absorption spectrum peaking at the maximum emission of LEDs chips. The absorption spectra for $Sr_2LiAlO_4:0.0625Eu^{2+}$ and $Sr_2LiAlO_4:0.125Ce^3$ were calculated using the Bethe-Salpeter equation (BSE) method on top of $G_0W_0$. FIGS. 7A and 7B respectively show the calculated absorption spectra for $Sr_2LiAlO_4:0.0625Eu^{2+}$ and $Sr_2LiAlO_4:0.125Ce$. In FIG. 7A $Eu^{2+}$ is located at the most stable site, Sr1 and $Sr_2LiAlO_4$: $0.125Ce^{3+}$ in FIG. 7B has the lowest energy $2Ce_{Sr}^{\bullet}+Li''_{Al}$ configuration. For both activated phosphors, the main absorption peaks are observed at 380-420 nm, which can be attributed to $4f^7 \rightarrow 4f^65d^1$ transition in $Eu^{2+}$ or $4f^1 \rightarrow 4f^05d^1$ transition in $Ce^{3+}$. These findings suggest that both $Eu^{2+}$- and $Ce^{3+}$-activated $Sr_2LiAlO_4$ can be efficiently excited by near-UV LED chips.

Synthesis and Photoluminescence Properties

Figures 8, 9:
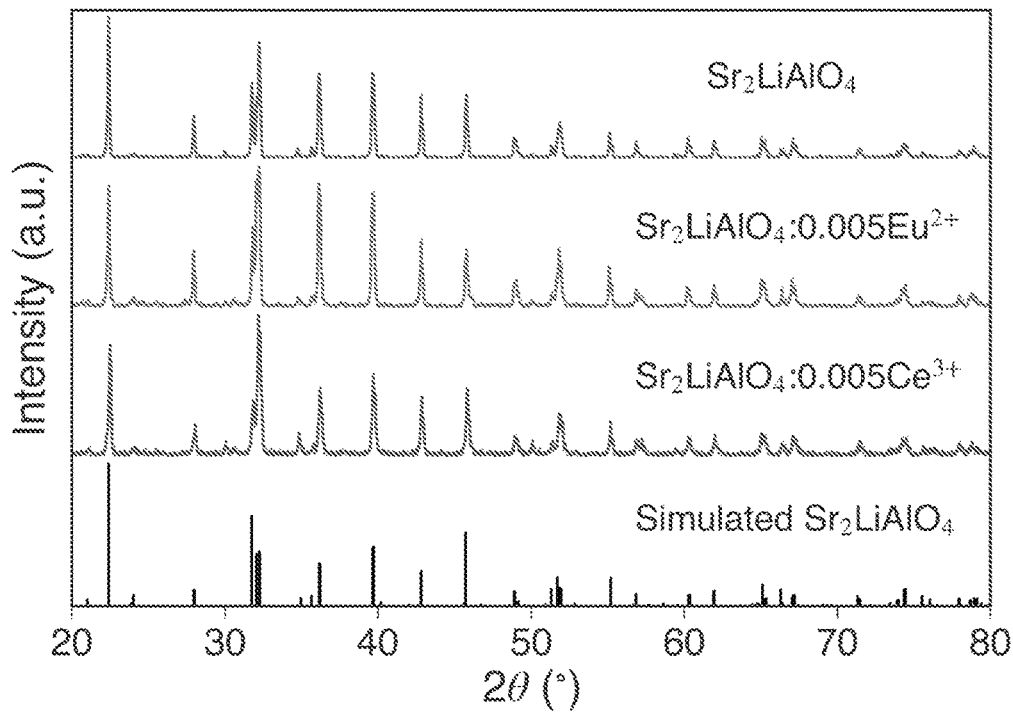
FIG. 8 shows the simulated and measured X-ray diffraction patterns of $Sr_2LiAlO_4$, $Sr_2LiAlO_4$:$0.005Eu^{2+}$ and $Sr_2LiAlO_4$:$0.005Ce^{3+}$.
FIG. 9 is a table (Table 3) showing the calculated lattice parameters and Rietveld refinement parameters of the X-ray diffraction profile of $Sr_2LiAlO_4$ synthesized with a solid-state reaction.
Figure 11A:
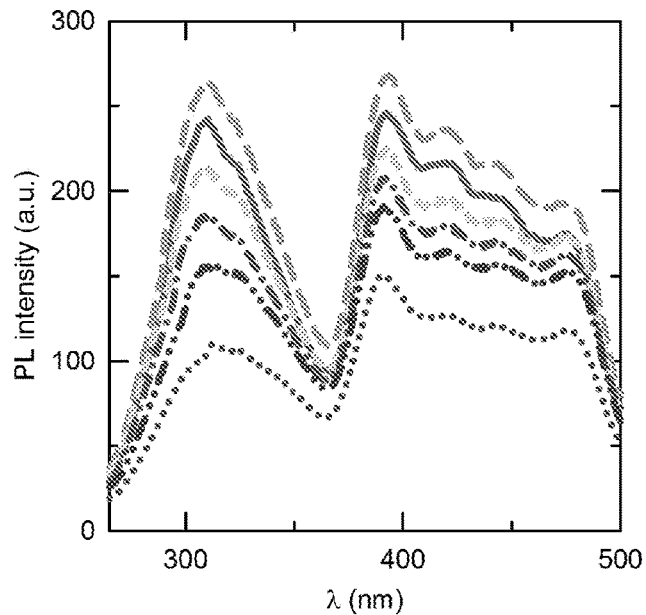
FIG. 11A shows the excitation spectra and FIG. 11B shows the emission spectra of $Sr_2LiAlO_4$:$xEu^{2+}$ phosphors.
Figure 11B:
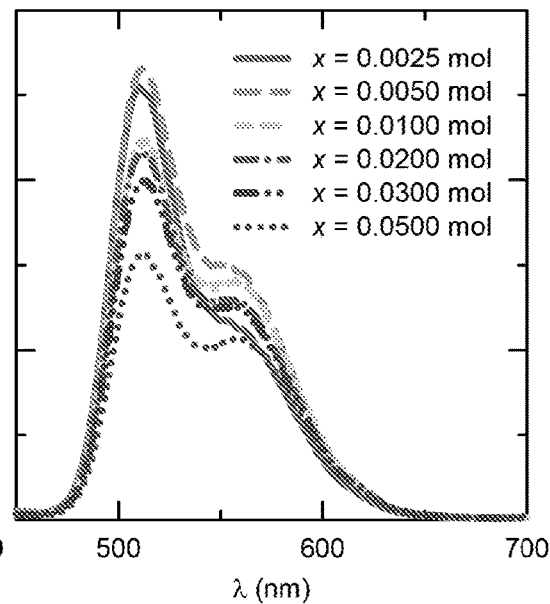
Figure 11C:
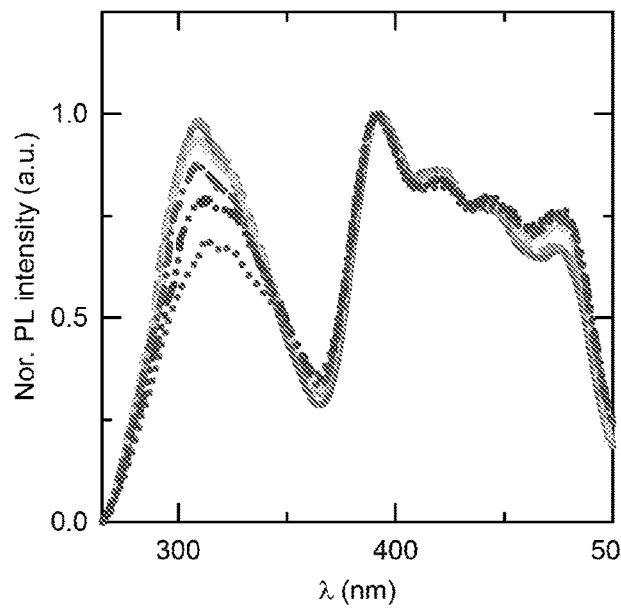
FIG. 11C shows the normalized excitation spectra and FIG. 11D shows the emission spectra of $Sr_2LiAlO_4$:$xEu^{2+}$ phosphors with respect to $Eu^{2+}$ concentration.
Figure 11D:
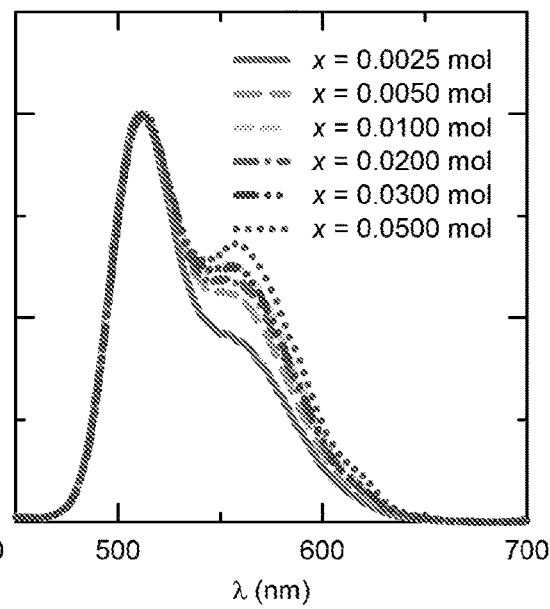

The $Sr_2LiAlO_4$ host and the $Eu^{2+}$- and $Ce^{3+}$-activated phosphors were successfully produced using solid-state reaction as well as combustion synthesis. Here, we will discuss primarily the results from the samples synthesized via solid-state reaction, given that this is the preferred approach in commercial applications due to its low cost, availability of precursors, and potential for production on an industrial scale. In general, other than a higher purity (94% versus 86% for solid-state reaction), the measured structural parameters and PL properties of the combustion-synthesized samples are very similar. FIG. 8 shows the simulated and measured XRD profiles of the host and activated phosphors, which are in excellent agreement and confirm the successful synthesis of the predicted $Sr_2LiAlO_4$ compound. The residual factors of Rietveld refinement analysis of the XRD profile (see Table 3 in FIG. 9) are $R_{wp}$=9.11%, $R_p$=6.69%, and goodness of fit (GOF)=2.79. Table 3 shows the calculated lattice parameters and Rietveld refinement parameters of the X-ray diffraction profile of $Sr_2LiAlO_4$ synthesized with a solid-state reaction. $R_{exp}$: is the expected residual factor, $R_{wp}$: is the weighted profile residual factor, $R_p$: is the profile residual factor and GOF is the goodness of fit. Values in parentheses are the estimated standard deviations of the last significant figure. As indicated from Tables 2 and 3, the refined structure parameters are also in excellent agreement with those from the DFT relaxed structure.

FIGS. 10A and 10B show the measured excitation and emission spectra of $Sr_2LiAlO_4:0.005Eu^{2+}$ and $Sr_2LiAlO_4$: $0.005Ce^{3+}$ phosphor, respectively. The measured PL spectrum of the $Sr_2LiAlO_4:0.005Eu^{2+}$ phosphor excited at 394 nm (FIG. 10A) shows a green-yellow emission peaking at 512 nm with a shoulder peak of 559 nm. The emission spectrum is broad (FWHM=73.6 nm) and asymmetric, indicating that $Eu^{2+}$ ions occupy two distinct sites in the $Sr_2LiAlO_4$ host. The excitation spectrum monitored at 512 nm shows a broad band with two main peaks at 310 nm and 394 nm. The PL spectrum of the $Sr_2LiAlO_4:0.005Ce^{3+}$ phosphor measured at 384 nm excitation (FIG. 10B) shows a broad blue emission with a main peak at 434 nm and a FWHM of 70.3 nm. The PL excitation recorded at 434 nm also presents two peaks—one major peak at 384 nm and one minor peak at 291 nm. The measured excitation spectra are consistent with the 4f-5d transitions of $Eu^{2+}/Ce^{3+}$ ions, and the BSE-computed excitation wavelengths in FIG. 7.

A careful optimization of the PL properties of $Sr_2LiAlO_4$: $xEu^{2+}$ and $Sr_2LiAlO_4:yCe^{3+}$ was carried out with respect to activator concentration (x, y). FIG. 10C shows the normalized emission intensity of $Sr_2LiAlO_4:xEu^{2+}$ (under 394 nm excitation, circular values) with respect to the $Eu^{2+}$ (x) concentration and $Sr_2LiAlO_4$:$yCe^{3+}$ (under 384 nm excitation, square values) with respect to the $Ce^{3+}$ (y) concentration. As FIG. 10C indicates, the emission intensity slightly increases and then decreases with increasing activator concentration, with the maximum emission intensity occurring at x or y=0.005 for both activators. The measured internal quantum efficiencies of the $Sr_2LiAlO_4$:$0.005Eu^{2+}$ and $Sr_2LiAlO_4$:$0.005Ce^{3+}$ phosphors are 25% ($\lambda_{ex}$=394 nm) and 32% ($\lambda_{ex}$=392 nm), respectively.

FIG. 11 presents the unnormalized and normalized PL spectra of $Sr_2LiAlO_4$:$xEu^{2+}$ with respect to a series of $Eu^{2+}$ concentrations (0.0025≤x≤0.0500) measured at room temperature. In particular, FIG. 11(A) shows the excitation and FIG. 11(B) shows the emission spectra of $Sr_2LiAlO_4$:$xEu^{2+}$ phosphors. Likewise, FIG. 11(C) shows the normalized excitation spectra and FIG. 11(D) shows the emission spectra of $Sr_2LiAlO_4$:$xEu^{2+}$ phosphors with respect to $Eu^{2+}$ concentration. With increasing $Eu^{2+}$ concentration, the relative intensity of short excitation wavelength (at 320 nm) gradually decreases, while the relative intensity of long wavelength (at 480 nm) slightly increases, as shown in FIG. 11(C). At the same time, a corresponding increase of emission intensity at 559 nm is also observed with increasing of $Eu^{2+}$ concentration when normalized based on emission intensity at 512 nm, as shown in FIG. 11D. We believe the lower energy emission (longer wavelength) peaks are associated with more $Eu^{2+}$ occupying the energetically more favorable Sr1 site. The calculated average bond length ($l_{av}$) of $EuO_8$ polyhedron in the Sr1 site and Sr2 site are 0.269 nm and 0.272 nm, respectively, while the distortion indices (D) (see Methods for definitions) are 0.056 and 0.044, respectively. A shorter $l_{av}$ and larger D is associated with a larger crystal field splitting (CFS). The larger CFS of $Eu^{2+}$ in the Sr1 site leads to a red shift in emission, as illustrated in FIG. 10D, which shows the schematic energy level diagram for $Eu^{2+}$/$Ce^{3+}$ ions in the $Sr_2LiAlO_4$ host crystal structure. $\Delta E_{ne}$ and $\varepsilon_{cfs}$ denote the centroid shift due to the nephelauxetic effect and the crystal field splitting of $Eu^{2+}$/$Ce^{3+}$ ions in the $Sr_2LiAlO_4$ host, respectively. $\Delta E_A$ is the photoionization barrier.

Figure 12A:
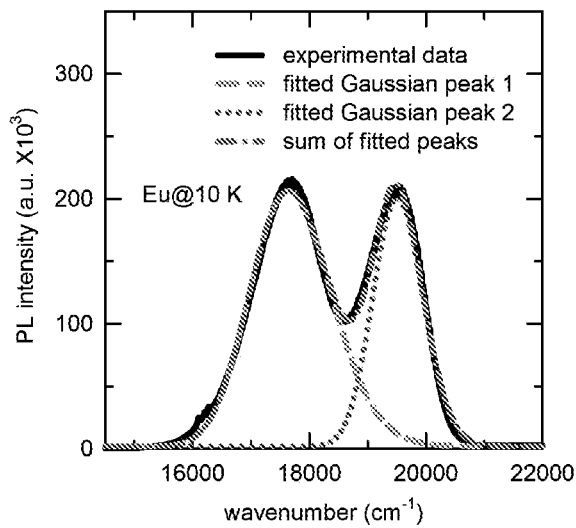
FIGS. 12A and 12B show the deconvoluted photoluminescence emission spectra of $Sr_2LiAlO_4:0.005Eu^{2+}$ at 10 K and 298 K, respectively.
Figure 12B:
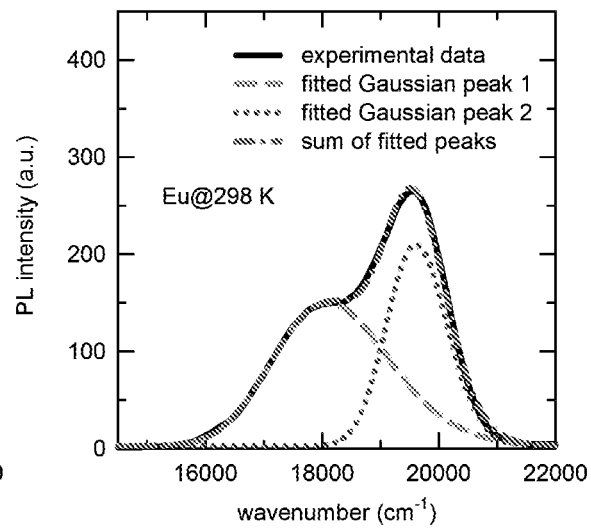
Figure 12C:
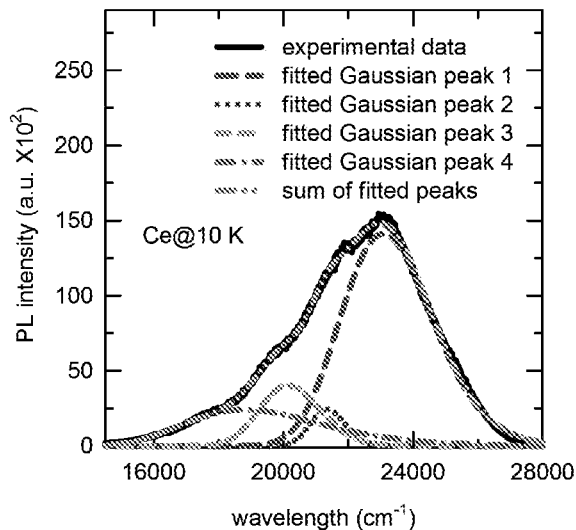
FIGS. 12C and 12D show the deconvoluted photoluminescence emission spectra of $Sr_2LiAlO_4:0.005Ce^{3+}$ phosphors at 10 K and 298 K, respectively.
Figure 12D:
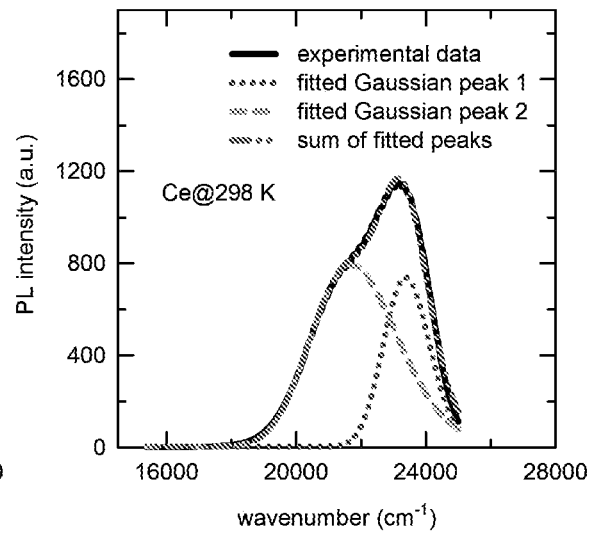
Figure 13:
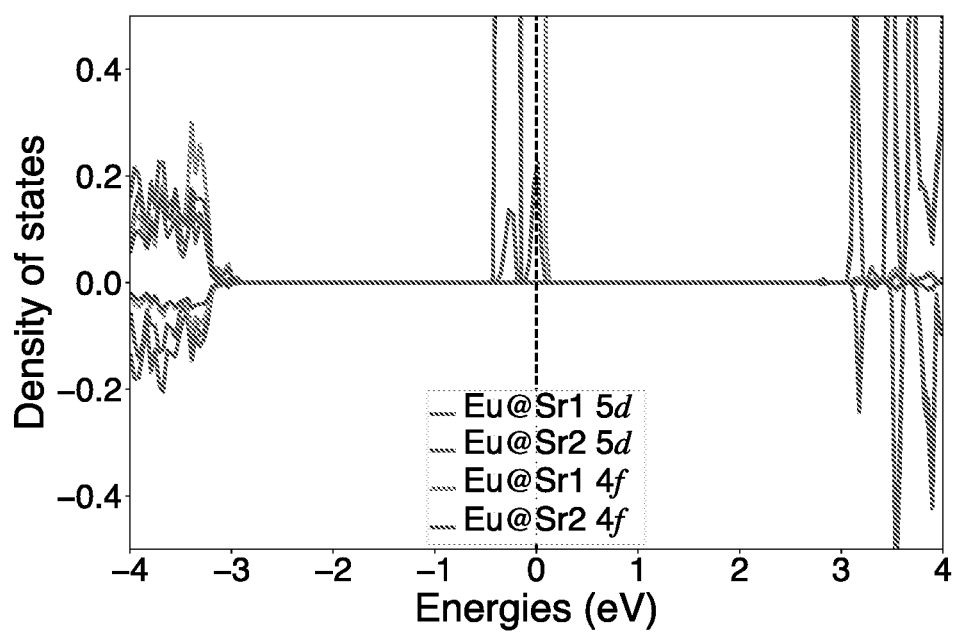
FIG. 13 shows the projected density of states of $Sr_2LiAlO_4:0.028Eu^{2+}$.

These conclusions are further supported by deconvolution of the PL emission spectra of $Sr_2LiAlO_4$:$0.005Eu^{2+}$ at 10 K and 298 K, which are shown in FIGS. 12A and 12B. FIGS. 12A and 12B show the deconvoluted photoluminescence emission spectra of $Sr_2LiAlO_4$:$0.005Eu^{2+}$ at 10 K and 298 K, respectively. FIGS. 12C and 12D show the deconvoluted photoluminescence emission spectra of $Sr_2LiAlO_4$:$0.005Ce^{3+}$ phosphors at 10 K and 298 K, respectively. As the figures indicate, there is a significant decrease in the long wavelength emission at room temperature. The lower thermal stability of the Eu in the Sr1 site is also a consequence of its larger CFS, which leads to a smaller barrier for photoionization ($\Delta E_A$). To obtain further support for these conclusions, we calculated the HSE projected density of states (FIG. 13) for a $Sr_2LiAlO_4$:$Eu^{2+}$ structure where Eu is introduced into both Sr1 and Sr2 simultaneously. In FIG. 13 a 3×3×2 supercell of $Sr_2LiAlO_4$ (72 formula units) was constructed with two Eu atoms, one on the Sr1 site and the other on the Sr2 site. We find that Eu in the Sr1 site has a smaller gap (longer excitation wavelength) between the 4f and 5d states compared to Eu in the Sr2 site.

Figure 14A:
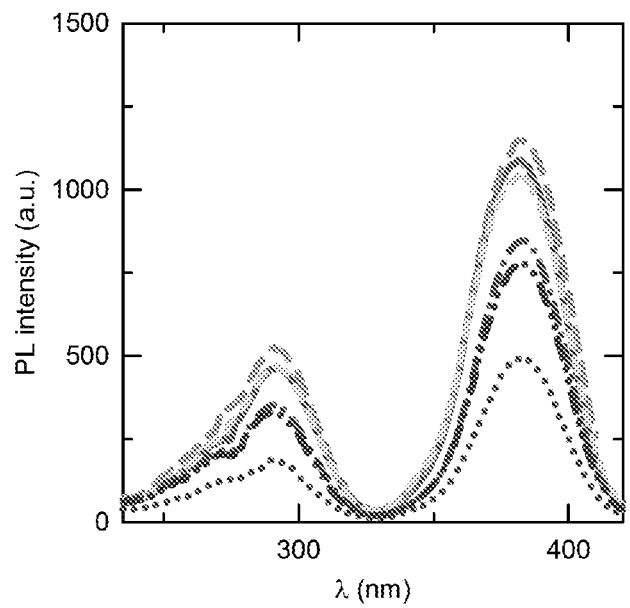
FIG. 14A shows the excitation spectra and FIG. 14B shows the emission spectra of $Sr_2LiAlO_4:yCe^{3+}$ phosphors with respect to $Ce^{3+}$ concentration.
Figure 14B:
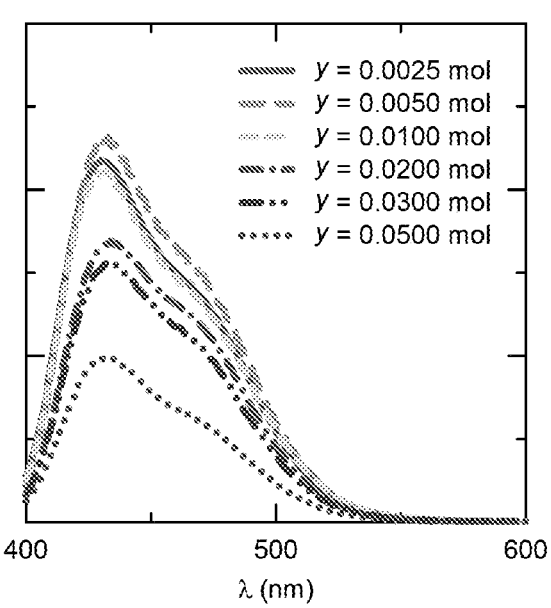
Figure 14C:
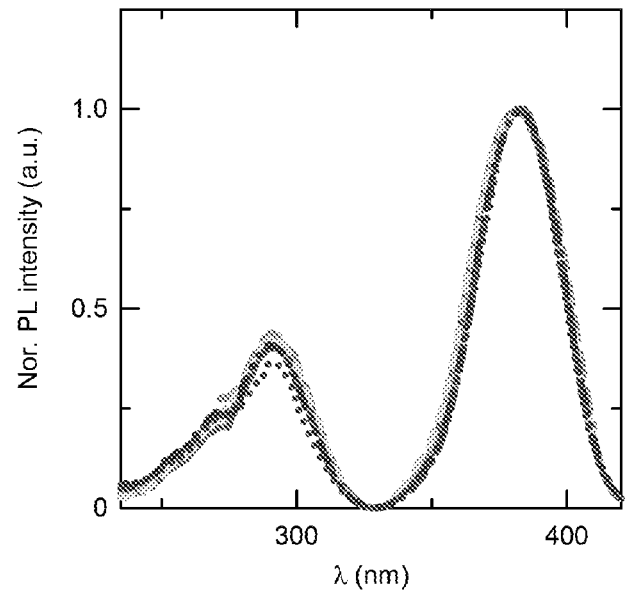
FIGS. 14C and 14D show the normalized excitation and emission spectra, respectively, of $Sr_2LiAlO_4:yCe^{3+}$ phosphors with respect to $Ce^{3+}$ concentration.
Figure 14D:
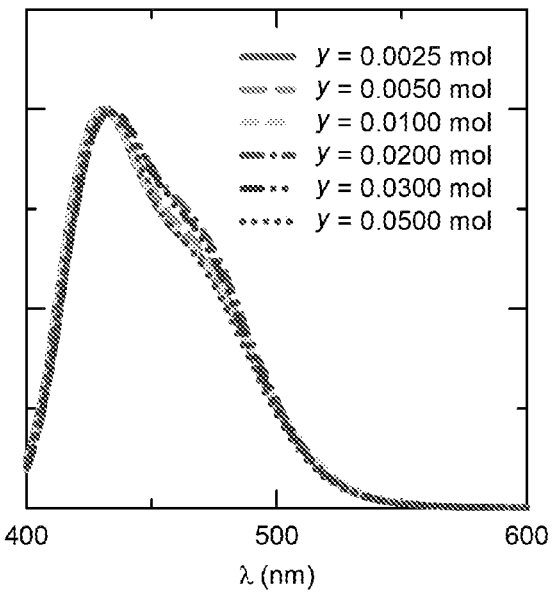

In contrast, there are no significant changes in the relative intensities of both the excitation and emission peaks at different wavelengths with increasing of $Ce^{3+}$ concentration in $Sr_2LiAlO_4$:$yCe^3$. FIG. 14 shows the photoluminescence excitation and emission spectra of $Sr_2LiAlO_4$:$yCe^{3+}$ phosphors. In particular, FIG. 14(A) shows the excitation spectra and FIG. 14(B) shows the emission spectra of $Sr_2LiAlO_4$:$yCe^{3+}$ phosphors with respect to $Ce^{3+}$ concentration. Likewise, FIGS. 14C and 14D show the normalized excitation and emission spectra, respectively, of $Sr_2LiAlO_4$:$yCe^{3+}$ phosphors with respect to $Ce^{3+}$ concentration. The emission spectra of $Sr_2LiAlO_4$:$0.005Ce^{3+}$ can be deconvoluted into four Gaussian peaks at 10 K with position of 433 (peak 1: 23,095 $cm^{-1}$), 468 (peak 2: 21,368 $cm^{-1}$), 497 (peak 3: 20,121 $cm^{-1}$), and 532 nm (peak 4: 18,797 $cm^{-1}$), as shown in FIG. 12C. The energy difference between peak 1 and peak 3 is about ~2,974 $cm^{-1}$ (0.37 eV), and between peak 2 and peak 4 is about ~2,571 $cm^{-1}$ (0.32 eV). These values correspond to the spin-orbit splitting energy of the lowest 4f level ($^2F_{5/2}$ and $^2F_{7/2}$) in $Ce^{3+}$. However, at 298 K (FIG. 12D), only two Gaussian peaks are observed at 427 nm (23,419 $cm^{-1}$) and 460 (21,739 $cm^{-1}$). These observations again suggest that the Sr1 site, associated with the long wavelength emission, is thermally unstable with no PL at room temperature.

Thermal Stability

Figure 15A:
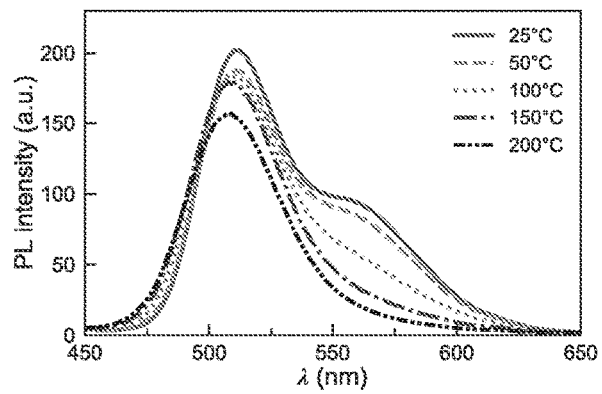
FIG. 15A shows the measured temperature-dependent emission spectra for $Sr_2LiAlO_4:0.005Eu^{2+}$ under 394 nm excitation in the temperature range of 25-200° C.
Figure 15B:
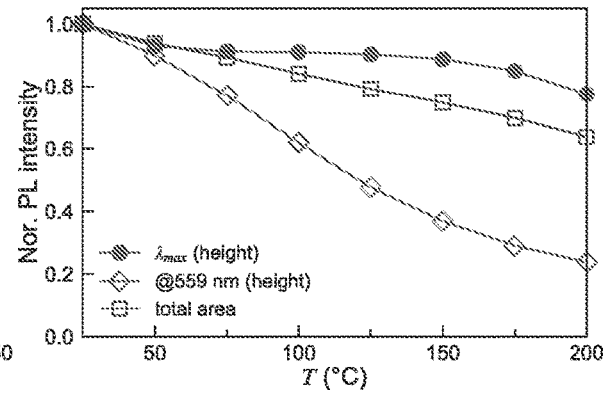
FIG. 15B shows the normalized temperature dependent emission intensity under the peak emission wavelength of 559 nm and the integrated emission intensity (total area) with a temperature interval of 25° C.
Figure 16A:
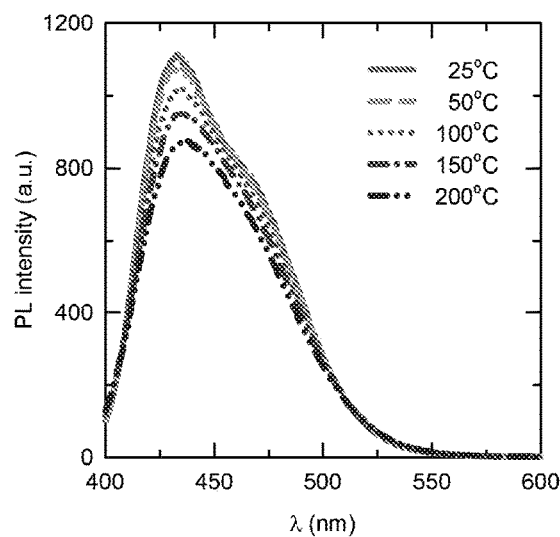
FIG. 16A shows the temperature-dependent emission spectra of $Sr_2LiAlO_4:0.005Ce^{3+}$ under 382 nm excitation in the temperature range of 25–200° C.
Figure 16B:
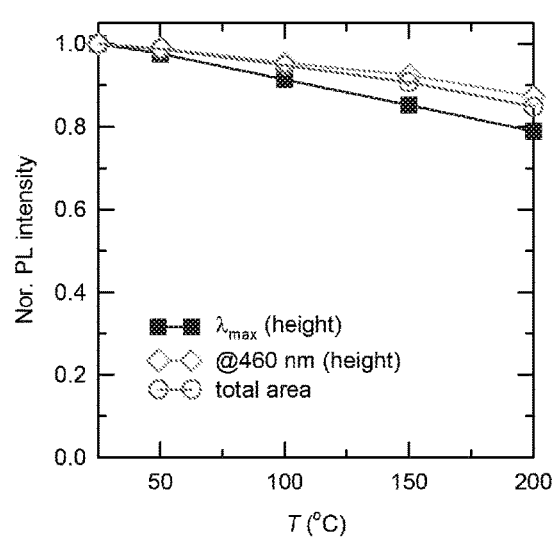
FIG. 16B shows the temperature-dependent normalized emission spectra of $Sr_2LiAlO_4:0.005Ce^{3+}$ under the peak emission wavelength, 460 nm and integrated emission intensity with a temperature interval of 25° C.

In practical applications, WLEDs typically operate at elevated temperatures (~150° C.), and a key metric of phosphor performance is its resistance to thermal quenching. FIG. 15A shows the measured temperature-dependent emission spectra for $Sr_2LiAlO_4$:$0.005Eu^{2+}$ under 394 nm excitation in the temperature range of 25-200° C. FIG. 15B shows the normalized temperature dependent emission intensity under the peak emission wavelength of 559 nm and the integrated emission intensity (total area) with a temperature interval of 25° C. At 150° C., the emission intensity of the main peak ($\lambda_{em}$=~512 nm) is about 88% of that at room temperature. The emission intensity of secondary peak ($\lambda_{em}$=~559 nm), which is associated with $Eu^{2+}$ in the thermally less stable Sr1 site on the other hand, reduces significantly with increasing temperature. Overall, $Sr_2LiAlO_4$:$0.005Eu^{2+}$ exhibits excellent resistance to thermal quenching. The $Sr_2LiAlO_4$:$0.005Ce^{3+}$ phosphor is found to have a slightly better resistance to thermal quenching, retaining 91% of room-temperature peak emission intensity at 150° C. This is illustrated in FIG. 16, which shows in FIG. 16A the temperature-dependent emission spectra under 382 nm excitation in the temperature range of 25-200° C. and in FIG. 16B shows the temperature-dependent normalized emission spectra under the peak emission wavelength, 460 nm and integrated emission intensity with a temperature interval of 25° C.

Performance of WLEDs

Finally, we constructed a prototype WLED device using $Sr_2LiAlO_4$:$Eu^{2+}$, $Sr_2LiAlO_4$:$Ce^{3+}$ as well as a mixture of $Sr_2LiAlO_4$:$Eu^{2+}$/$Ce^{3+}$. The electroluminescence (EL) spectra of these WLEDs are shown in FIGS. 20A-20C. FIG. 20(A) shows the electroluminescence (EL) spectra and photograph of the InGaN LED ($\lambda_{max}$=400 nm)+$Sr_2LiAlO_4$:$0.005Ce^{3+}$ phosphor. FIG. 20(B) shows the EL spectra and photograph of the InGaN LED ($\lambda_{max}$=400 nm)+$Sr_2LiAlO_4$:$0.005Ce^{3+}$+$Sr_2LiAlO_4$:$0.005Eu^{2+}$ phosphor. FIG. 20(C) shows the EL spectra and photograph of the InGaN LED ($\lambda_{max}$=450 nm)+$Sr_2LiAlO_4$:$0.005Eu^{2+}$ phosphor. FIG. 20(D) shows a photo of WLEDs packaged with $Sr_2LiAlO_4$:$0.005Eu^{2+}$ phosphor. FIG. 20(E) shows the CIE chromatic coordinated of the fabricated $Sr_2LiAlO_4$-based phosphors WLED under various forward bias currents.

The prototype WLED using $Sr_2LiAlO_4$:$Eu^{2+}$ exhibits CIE color coordinates of 0.301 and 0.323, with high CRI of 93 and a CCT of 7527 K at a forward bias current of 60 mA (see Table 4 in FIG. 17, which shows the optical properties of a WLED fabricated using a $Sr_2LiAlO_4:0.005Eu^{2+}$ phosphor with a blue LED ($\lambda_{max}$=450 nm) excitation). The excellent CRI of the $Sr_2LiAlO_4:Eu^{2+}$ phosphor can be attributed to the feature of its broad band emission by two Sr sites. The CCT of the WLED can be further lowered by using a mixture of $Sr_2LiAlO_4:Eu^{2+}/Ce^{3+}$, as shown in Table 5 in FIG. 18, as well as via the addition of a red component. Table 5 shows the optical properties of WLED fabricated using the mixed $Sr_2LiAlO_4:0.005Ce^{3+}$ and $Sr_2LiAlO_4:0.005Eu^{2+}$ phosphor with near-UV LED ($\lambda_{max}$=400 nm) excitation. For instance, the recently reported $SrLiAl_3N_4:Eu^{2+}$ narrow-band red phosphor[1] would be a particularly interesting option, which would allow for the construction of an oxide+nitride device using the same earth-abundant elements. The measured luminous efficacy of WLEDs with $Sr_2LiAlO_4:Eu^{2+}/Ce^{3+}$ phosphors are 19~36 lm/W, which is comparable to WLEDs utilizing some recently reported novel phosphors, but still somewhat lower than that of commercial WLEDs utilizing the $Y_3Al_5O_{12}:Ce^{3+}$ phosphor. Table 6 in FIG. 19 shows the internal quantum efficiency (IQE) and photoluminescence (PL) intensity of several phosphors and correlated color temperature (CCT), color rendering index (CRI) and luminous efficacy (LE) of a white light-emitting diode (WLED) constructed with these phosphors. To further improve the quantum efficiency of $Sr_2LiAlO_4$, crystal-site engineering techniques, e.g., co-doping with Ba or Ca, may be used to shift the energetic preference and/or tune the CFS of the two Sr sites.

To conclude, we have identified a new earth-abundant $Sr_2LiAlO_4$ phosphor host—the first known Sr—Li—Al—O quaternary compound—by composing a "solid-state lighting" periodic table based on statistical analysis of the ICSD to identify unexplored, yet promising chemical spaces with data-mined structure prediction and high-throughput DFT property computations. $Sr_2LiAlO_4$ comprises inexpensive, earth-abundant elements (other than the rare-earth activator, which is required in small quantities), and the DFT and PL results show $Sr_2LiAlO_4:Eu^{2+}/Ce^{3+}$ to have efficient near-UV excitation, good thermal quenching resistance and broad green-yellow/blue emission. High purity $Sr_2LiAlO_4$-based phosphors can be synthesized with scalable, industrially-relevant methods. We therefore believe the new $Sr_2LiAlO_4$: $Eu^{2+}/Ce^{3+}$ phosphors to be highly promising candidates for low-cost, high-CRI WLED applications.

Experimental Procedures

New crystal structure candidates for the target chemistries were generated by applying a retrained version of the ionic substitution algorithm developed by Hautier et al, "Data Mined Ionic Substitutions for the Discovery of New Compounds," Inorg. Chem. 50, 656-663, on the Inorganic Crystal Structure Database (ICSD). This algorithm codifies data-mined probabilities for substitution of one species by another. New candidates are generated by performing high-probability substitutions on a list of known crystal structures, in this case, all ordered crystal structures in the 2017 version of the ICSD.

All density functional theory (DFT) calculations were carried out using the Vienna ab initio simulation package (VASP) within the projector-augmented wave method. The generalized gradient approximation Perdew-Burke-Ernzerhof (PBE) functional was used for structural relaxations and energy calculations. The plane wave energy cutoff was 520 eV, and the Brillouin zone was integrated with a k-point grid at least of 100 per Å$^3$ (reciprocal lattice volume). All host crystal structures were relaxed with parameters in line with Materials Project. The $Eu^{2+}/Ce^{3+}$-activated phosphor structures were fully relaxed until the energies and forces were converged to 10$^{-5}$ eV and 0.01 eV/Å, respectively. All crystal structure manipulations and data analysis were carried out using the Python Materials Genomics package.

The phase stabilities of the predicted Sr—Li—Al—O compounds were estimated by calculating the energy above the linear combination of stable phases in the 0 K DFT phase diagram, also known as the energy above hull, $E_{hull}$. Previous studies have shown that ~60% of ICSD oxides have $E_{hull}$ less than 30 meV/atom; we therefore use this threshold as a reasonable cutoff for synthesizability. For phase diagram construction, the energies of all compounds other than those of direct interest in this work were obtained from the Materials Project via the Materials Application Programming Interface. Further, the dynamical stability of the identified $Sr_2LiAlO_4$ host was evaluated by computing the phonon spectrum using density functional perturbation theory as implemented in the Phonopy code in conjunction with VASP as the force calculator. More stringent energy and force criteria of 10$^{-8}$ eV and 10$^{-4}$ eV/Å, respectively, were used for these calculations.

Defect formation energies were calculated using the formalism presented by Wei et al.:

$$E_f = E_{tot}^D - E_{tot}^B - \sum_i n_i \mu_i$$

where $E_{tot}^D$ and $E_{tot}^B$ are the total energies of the structure with and without the defect(s), respectively; $\mu_i$ is the atomic chemical potential of species i; $n_i$ indicates the number of atoms of species i being added ($n_i$>0) or removed ($n_i$<0) to form the defect. $\mu_i$ is estimated based on the chemical potentials for each specie based on the relevant region of the 0 K DFT phase diagram. The host band gaps were calculated using PBE for the initial rapid screening, and more detailed investigations of the electronic structure of $Sr_2LiAlO_4$ were carried out using the more computationally expensive and accurate screened hybrid Heyd-Scuseria-Ernzerhof (HSE) functional and single-shot GW method. The Bether-Salpeter equation (BSE) simulation was performed on top of $G_0W_0$ to calculate the absorption spectrum of $Eu^{2+}/Ce^{3+}$-activated $Sr_2LiAlO_4$ phosphors. A large supercell model (2×2×2, 128-atoms) was adopted to mimic the relatively low $Eu^{2+}/Ce^{3+}$ concentrations in experiment, and to avoid interactions between periodic images of activators.

The Debye temperature, $\Theta_D$, was evaluated using the quasi-harmonic model. The elastic tensor was calculated with more stringent electronic convergence criterion of 10$^{-6}$ eV, and the elastic moduli were calculated using the Voigt-Reuss-Hill approximation.

The local environment of the $Eu^{2+}$ activator was characterized using the average Eu—O bond length ($l_{av}$) and the distortion index (D) of the $EuO_8$ coordination polyhedron. As per previous works, D is defined given by $$D = \frac{1}{n} \sum_{i=1}^{n} \frac{|l_i - l_{av}|}{l_{av}},$$

where $l_i$ is the distance from the center atom to the ith coordinating atom, and n is the total number of Eu—O bonds (n=8 in this case).

Solid state reaction synthesis was performed using SrO (Kojundo, 99.9%), $Li_2CO_3$ (Kojundo, 99.9%), $\alpha$-$Al_2O_3$ (Kojundo, 99.9%), and $Eu_2O_3$ (Kojundo, 99.9%) or $CeO_2$ (Kojundo, 99.99%). Stoichiometric amounts of the starting materials were ground in agate mortar, placed in alumina crucibles, and fired at 900° C. for 4 h in a horizontal tube furnace using a 25% $H_2/N_2$ gas mixture to obtain $Sr_2LiAlO_4$:$xEu^{2+}$ and $Sr_2LiAlO_4$:$yCe^{3+}$ (0.0025≤x, y≤0.0500). After heat treatment, the samples were cooled to room temperature and ground well with agate mortar into fine powders for further analysis. Excess Li source of up to 10 wt % was introduced to compensate for Li evaporation during synthesis.

Combustion reaction synthesis was performed using $Sr_2(NO_3)_2$ (99.99%, Sigma Aldrich), $LiNO_3$ (ReagentPlus, Sigma Aldrich), $Al(NO_3)_3 \cdot 9H_2O$ (ACS reagent, J. T. Baker), $Eu(NO_3)_3$ from $Eu_2O_3$ (99.99%, Alfa Aesar) with nitric acid (69.3%, Fisher Scientific), and $Ce(NO_3)_3$ (99.99%, Alfa Aesar) as precursors, assisted by the exothermal reaction between urea (Certified ACS, Fisher Scientific) and ammonium hydroxide (Certified ACS, Fisher Scientific) at 600° C. A post-annealing condition was 800° C. for five hours in a 5% $H_2$/95% $N_2$ atmosphere to transform $Eu^{3+}$ to $Eu^{2+}$ to obtain $Sr_2LiAlO_4$:$xEu^{2+}$ and $Sr_2LiAlO_4$:$yCe^{3+}$ (0.001<x, y≤0.040). Excess Li source of up to 25 wt % was introduced to compensate for Li sublimation during synthesis.

The powders by combustion reaction were analyzed by X-ray diffraction (XRD, Bruker D2 Phaser, Karlsruhe, Germany) using $CuK\alpha$ radiation and a step size of 0.0140 over a 2θ range of 20 to 80°. X-ray diffraction (XRD) data of powders by solid state reaction were obtain using $CuK\alpha$ radiation (Philips X'Pert). XRD data were collected over angles of 10°≤2θ≤120° with a step size of 0.026°. Structural information of the synthesized samples was derived by refinement using the TOPAS software suite from the XRD result. The VESTA program was used to draw the crystal structure.

Photoluminescence of the solid-state-reaction synthesized samples was measured using a Hitachi F-4500 fluorescence spectrophotometer over a wavelength range of 200-700 nm. The quantum yield was measured with 394 nm and 450 nm excitation using a xenon laser (Hamamatsu C9920-02) at the Korea Photonics Technology Institute (KOPTI), Gwangju, South Korea. The thermal quenching characteristics were measured in the temperature range of 25-200° C., connected to the Hitachi F-4500 fluorescence spectrophotometer with the integrated heater, temperature controller, and thermal sensor. Low-temperature PL spectra were obtained under excitation at 325 nm He—Cd laser connected to the cryostat system at the temperature of 10 K in the KOPTI, Gwangju, South Korea.

The white LED device prototype was fabricated by integrating the $Sr_2LiAlO_4$:$0.005Ce^{3+}$ and mixed $Sr_2LiAlO_4$:$0.005Ce^{3+}$/$Eu^{2+}$ phosphors on a InGaN near UV LED chip ($\lambda_{max}$=400 nm) and the $Sr_2LiAlO_4$:$0.005Eu^{2+}$ phosphor on a InGaN blue LED chip ($\lambda_{max}$=450 nm). The device was then encapsulated in a phosphor/silicon resin mixture, with the mixture placed directly on the headers of LED chip and cured at 150° C. for 1 h. After the packaging was completed, the WLED device was measured in an integrating sphere under direct current forward bias condition.

FIG. 21 shows a schematic diagram of one example of an exemplary LED assembly 100 according to the disclosed embodiments. The LED assembly may include a semiconductor UV or blue radiation source, such as a light emitting diode (LED) chip 105 and leads 110 electrically attached to the LED chip 105. The leads 110 may provide power to the LED chip 105 that may cause the LED chip 105 to emit radiation.

In one embodiment, the LED assembly 100 may include any semiconductor blue or UV light source that is capable of producing white light when its emitted radiation is directed through a luminescent material 115. In at least one embodiment, the semiconductor light source may include a blue emitting LED chip doped with various impurities. For example, the LED chip 105 may have at least one semiconductor layer including GaN, ZnSe or SiC. In some embodiments, the LED chip may be a UV or blue emitting LED having a peak emission wavelength from about 400 to about 470 nm.

The LED chip 105 may be encapsulated within a shell 120 which encloses the LED chip. The shell 120 may be made of, for example, a glass or plastic material and may be transparent or substantially optically transmissive with respect to wavelengths of light produced by the LED chip 105 and the luminescent material 115. The LED chip 105 and the shell 120 may be mounted on a substrate 125.

According to some of the disclosed embodiments, the luminescent material 115 may include any combination of one or more of the phosphors described herein. In particular, the phosphor may include a quaternary compound M-Li—Al—O, where M is Ba, Sr, or Ca, activated by $Eu^{2+}$ or $Ce^{3+}$. For instance, the quaternary compound is $M_2LiAlO_4$, $MLi_3AlO_4$ or $MLiAlO_3$.

The invention claimed is:
1. A light emitting diode (LED) assembly, comprising:
an LED light source having a first light output with a characteristic spectrum; and
at least one phosphor through which the first light output passes, the at least one phosphor including a quaternary compound $M_2LiAlO_4$, where M is Ba, Sr, or Ca, activated by $Eu^{2+}$ or $Ce^{3+}$.
2. The LED assembly of claim 1 wherein the LED light source is a blue LED.
3. The LED assembly of claim 1 wherein the LED light source is a near ultraviolet (UV) LED.
4. A light emitting diode (LED) assembly, comprising:
an LED light source having a first light output with a characteristic spectrum; and
at least one phosphor through which the first light output passes, the at least one phosphor including a quaternary compound Sr—Li—Al—O activated with $Eu^{2+}$, wherein the at least one phosphor includes a plurality of phosphors, a first phosphor including $Sr_2LiAlO_4$ activated by $Eu^{2+}$ and a second phosphor including $Sr_2LiAlO_4$ activated by $Ce^{3+}$.
5. The LED assembly of claim 4 wherein the LED light source is a near ultraviolet (UV) LED.
6. A light emitting diode (LED) assembly, comprising:
an LED light source having a first light output with a characteristic spectrum; and
at least one phosphor through which the first light output passes, the at least one phosphor including a quaternary compound $MLiAlO_3$, where M is Ba, Sr, or Ca, activated by $Eu^{2+}$ or $Ce^{3+}$.

* * * * *